(12) United States Patent  (10) Patent No.: US 8,277,906 B2
Kim et al.  (45) Date of Patent: Oct. 2, 2012

(54) METHOD OF PROCESSING A SUBSTRATE

(75) Inventors: Yoon-jae Kim, Seoul (KR); Yong-jin Kim, Suwon-si (KR); Ken Tokashiki, Seongnam-si (KR); Keun-hee Bai, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 701 days.

(21) Appl. No.: 12/469,776

(22) Filed: May 21, 2009

(65) Prior Publication Data

US 2010/0062613 A1  Mar. 11, 2010

(30) Foreign Application Priority Data

Sep. 9, 2008 (KR) .................. 10-2008-0088915

(51) Int. Cl.
H05H 1/24 (2006.01)

(52) U.S. Cl. ...................................... 427/569; 427/576

(58) Field of Classification Search .................. 427/569, 427/576; 117/92, 103
See application file for complete search history.

(56) References Cited

U.S. PATENT DOCUMENTS

| 6,391,659 B1* | 5/2002 | Kwon et al. ...................... 438/3 |
| 2002/0079058 A1* | 6/2002 | Okumura et al. ........ 156/345.48 |
| 2004/0129212 A1* | 7/2004 | Gadgil et al. .................. 118/715 |
| 2005/0074983 A1* | 4/2005 | Shinriki et al. ................ 438/785 |
| 2005/0287307 A1* | 12/2005 | Singh et al. .................... 427/523 |
| 2006/0269694 A1* | 11/2006 | Honda et al. ................... 427/569 |
| 2009/0011149 A1* | 1/2009 | Kashiwagi et al. ............ 427/578 |

FOREIGN PATENT DOCUMENTS

| EP | 1039501 A2 | 9/2000 |
| EP | 1039501 A3 | 9/2003 |
| EP | 1039501 B1 | 11/2005 |
| JP | 7-58024 | 3/1995 |
| JP | 7-97208 | 4/1996 |
| JP | 2000-147207 | * 5/2000 |
| JP | 2000-223424 | 8/2000 |

OTHER PUBLICATIONS

Ishikawa, Yasushi, et al., "Reduction of plasma-induced damage in SiO2 films during pulse-time-modulated plasma irradiation". J. Vac. Sci. Technol. B 23(2), Mar./Apr. 2005 pp. 389-394.*

Samukawa, Seiji, et al., "Reduction of plasma induced damage in an inductively coupled plasma using pulsed source power". J. Vac. Sci. Technol. B 18(2), Mar./Apr. 2000 pp. 834-840.*

* cited by examiner

Primary Examiner — Bret Chen
(74) Attorney, Agent, or Firm — Onello & Mello, LLP

(57) ABSTRACT

A method of processing a substrate using plasma includes loading a substrate into a chamber, processing the substrate with a first plasma mode and then processing the substrate with a second plasma mode, wherein at least one of the first plasma mode and the second plasma mode is a time-modulation mode in which a plasma induced in the chamber is periodically turned on and off to reduce plasma-induced damage in the substrate.

14 Claims, 7 Drawing Sheets

METHOD OF PROCESSING A SUBSTRATE

CROSS-REFERENCE TO RELATED APPLICATIONS

This application claims the benefit of Korean Patent Application No. 10-2008-0088915, filed on Sep. 9, 2008, in the Korean Intellectual Property Office, the disclosure of which is incorporated herein in its entirety by reference.

BACKGROUND

The present invention is related to a method of processing a substrate using a plasma apparatus, e.g., to manufacture a semiconductor device.

With increasing demand for integration and high performance in terms of manufacturing semiconductor devices, design rules (e.g., design parameters on geometry and connectivity) and sizes of layers stacked in the semiconductor devices need to be reduced. More specifically, due to reductions in design rules, use of a semiconductor processing apparatus using high-density plasma (HDP) has increased to improve a gap-filling capacity.

SUMMARY

Described herein are methods of processing a substrate. In one embodiment, the method of processing a substrate includes loading a substrate in a chamber and processing the substrate with a first plasma mode and then with a second plasma mode, wherein at least one of the first plasma mode and the second plasma mode is a time-modulation mode in which a plasma induced in the chamber is periodically turned on and off to reduce plasma-induced damage (PID) in the substrate.

The time modulation mode can be controlled by periodically turning on and off a power source for inducing the plasma. The power supply for inducing the plasma can be an upper radio-frequency (RF) power supplied to upper electrodes disposed on the substrate. In one embodiment, the power for inducing the plasma includes both (a) an upper RF power supplied to upper electrodes disposed on the substrate and (b) a lower RF power supplied to lower electrodes disposed under the substrate, wherein in the time-modulation mode, both the upper RF power and the lower RF power are periodically turned on and off.

The time-modulation mode can be controlled by periodically turning on and off (i.e., starting and stopping) introduction of at least one process gas for inducing the plasma. Introduction of the at least one process gas can be controlled by periodically turning on and off at least one high-speed gas puffing valve attached to the chamber.

Both the first plasma mode and the second plasma mode can be the time-modulation mode.

In another embodiment, the first plasma mode is a continuous-operation mode in which the plasma is continuously turned on, while the second plasma mode is the time-modulation mode. The pressure in the chamber in the second plasma mode can be higher than the pressure in the chamber in the first plasma mode.

The method can further include thirdly processing the substrate in a third plasma mode. The third plasma mode can be the continuous-operation mode in which the plasma is continuously turned on. The pressure in the chamber in the third plasma mode can be lower than the pressure in the chamber in the second plasma mode. Alternatively, the first plasma mode, the second plasma mode, and the third plasma mode can all be the time-modulation mode.

The chamber can occupy at least a portion of a high-density plasma chemical vapor deposition (HDP-CVD) apparatus. The first processing of the substrate (with the first plasma mode) and/or the second processing of the substrate (with the second plasma mode) can include depositing a material layer on the substrate. The material layer can include an insulating material.

In one form of the method, the method of processing a substrate includes loading a substrate in a chamber of a high-density plasma chemical vapor deposition (HDP-CVD) apparatus and depositing a material layer on the substrate by using a plasma with a time-modulation mode, wherein plasma in the time-modulation mode is obtained by periodically turning on and off the plasma induced in the chamber to reduce plasma-induced damage (PID) in the substrate.

The method can further include stabilizing the plasma in the continuous-operation mode before depositing the material layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EMBODIMENTS

Figure 1:
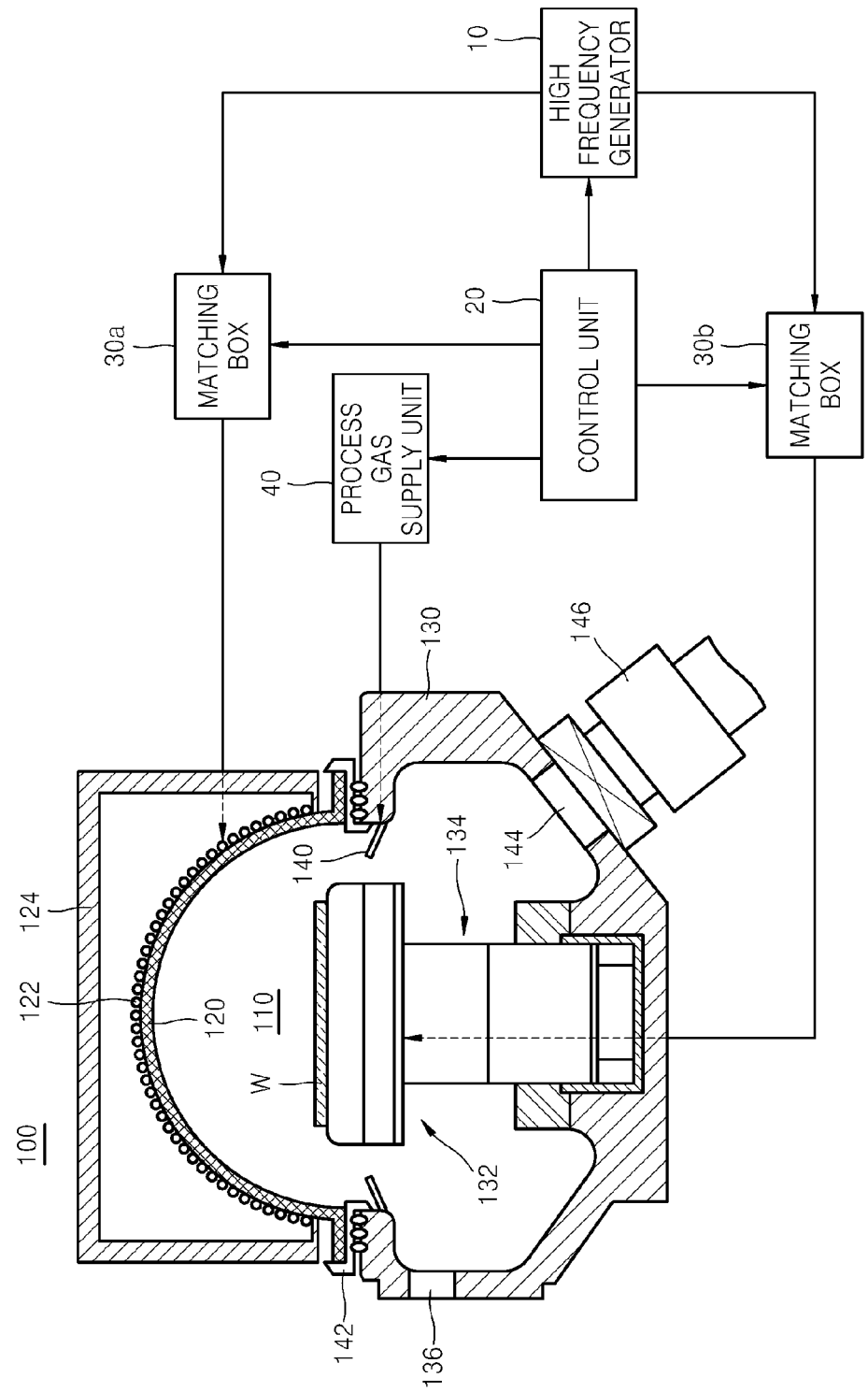
FIG. 1 schematically illustrates an apparatus for processing a substrate.

Reference will now be made in detail to exemplary embodiments, which are illustrated in the accompanying drawings. The invention, however, is not limited to the particular embodiments illustrated hereinafter, as various aspects of the subject matter introduced above and discussed in greater detail below are not limited to any particular manner of implementation and may be implemented in any of numerous ways. Accordingly, the embodiments described and illustrated herein are rather introduced primarily for illustrative purposes. In the drawings, the thicknesses of layers and regions are exaggerated for clarity.

It will be understood that when an element (such as a layer, a region, or a substrate) is referred to as being "on," "connected to" or "coupled to" another element, it can be directly on, connected or coupled to the other element; alternatively, intervening elements can be present. In contrast, when an element is referred to as being "directly on," "directly connected to" or "directly coupled to" another element or layer, no intervening elements or layers are present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the exemplary embodiments.

Spatially relative terms, such as "above," "upper," "beneath," "below," "lower," and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" can encompass both an orientation of above and below. The device can be otherwise oriented (rotated 90 degrees or at other orientations), and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

An embodiment of an apparatus 100 for processing a semiconductor substrate is schematically illustrated in FIG. 1. The apparatus 100 includes a chamber 110; the chamber 110 is sealed from the outside and provides a space for processing. In a particular example, the apparatus 100 for processing a semiconductor can be a high-density plasma chemical vapor deposition (HDP-CVD) apparatus. However, the present embodiment is not limited thereto, and the apparatus 100 for processing a semiconductor substrate can alternatively take other forms, such as a plasma-enhanced (PE) CVD apparatus or a plasma etching apparatus.

The chamber 110 can include, in particular examples, an upper chamber 120 and a lower chamber 130. The upper chamber 120 can be formed of, for example, quartz and can have a dome form, in which a lower portion thereof is open. Upper electrodes 122 can be disposed on the outer wall of the upper chamber 120 to cover the upper chamber 120. In the HDP-CVD apparatus, electric power having a frequency of about 100 KHz to about 13.56 MHz can be applied to the upper electrodes 122. The upper electrodes 122 can be blocked and protected from the outside by a cover 124.

The lower chamber 130 includes a substrate supporter 132 and a driving unit 134. Additionally, a loading window 136 is disposed in the side wall of the lower chamber 130. A substrate W is loaded through the loading window 136 and is mounted on the substrate supporter 132. Next, the substrate W is moved by the driving unit 134 to a position for plasma processing. The substrate W can be, for example, a silicon substrate, a germanium substrate, a silicon-germanium substrate, a silicon-on-insulator substrate, a silicon-on-sapphire substrate, or a gallium-arsenide substrate. The substrate supporter 132 can be, for example, an electrostatic chuck (ESC), which sucks and fixes the substrate W by electrostatic force; in other embodiments, the substrate supporter 132 can include a clamp for fixing the substrate W.

The driving unit 134 moves the substrate supporter 132 upward and downward in the chamber 110. That is, when the substrate W is loaded into or unloaded from the chamber 110 through the loading window 136, the substrate supporter 132 is disposed lower than the loading window 136, which is defined in the lower chamber 130. When a deposition process is performed, however, the substrate supporter 132 rises to reach a certain level at which the substrate W remains a predetermined distance from plasma generated in the upper chamber 120.

The chamber 110 includes a gas-supply nozzle 140, and process gas is supplied into the chamber 110 through the gas-supply nozzle 140. The chamber 110 also includes a gas plate 142; the gas plate 142 is attached between the upper chamber 120 and the lower chamber 130 and prevents leakage of the process gas. An exhaust hole 144 defined in a lower portion of the lower chamber 130 is connected to an exhaust pipe 146 disposed outside of the lower chamber 130. The exhaust pipe 146 can be connected to a vacuum pump (not illustrated) and can thereby discharge unwanted by-products that are generated during processing. Additionally, the vacuum pump can maintain a degree of vacuum in the chamber 110 during processing.

Hereinafter, operation methods of the HDP-CVD apparatus, which is presented as an example of the apparatus 100 for processing a semiconductor substrate, are described. The process gas is introduced into the chamber 110 through the gas-supply nozzle 140. The introduced process gas can vary according to the type of a material layer to be formed. For example, when forming a silicon oxide layer and/or a nitride layer, a mixed gas including $SiH_4$, $H_2$, $NH_3$, and/or $N_2$, can be used. When forming an amorphous silicon layer, $SiH_4$ and/or $H_2$ can be used. In addition, when an impurity-containing amorphous silicon layer is formed by doping impurities (for example, phosphorus, P) to increase electron mobility, $PH_3$ can be added into the reaction gas for forming the amorphous silicon layer. The process gas introduced into the chamber 110 is decomposed by plasma formed in the chamber 110 to generate radicals, and the radicals and gas ions are recombined to form a material layer on the substrate W.

In various embodiments, the plasma that is generated in the chamber can be formed by the following processes.

A high-frequency generator 10 generates a high-frequency signal according to control by a control unit 20. In general, the frequency signal is generated by matching an impedance of, for example, 50 ohms. The impedance of the chamber 110 can be adjusted to match the impedance of the frequency signal generated in the high-frequency generator 10, for example, the impedance of 50 ohms. When impedances of the frequency signal and the chamber 110 are not matched, a reflected power that flows backward to the high-frequency generator 10 may be generated. Thus, in order to match these impedances, matching boxes 30a and 30b that correct a resistance value of the chamber 110 can be used; and, thereby, the frequency signal with the highest efficiency is supplied to the chamber 110.

The control unit 20 controls a process-gas supply unit 40 and supplies the process gas into the chamber 110. The process gas receives energy from the frequency signal to form plasma in the chamber 110. The process gas in a plasma state can form a material layer on the substrate W or can etch a material layer formed on the substrate W. The process-gas supply unit 40 can supply the process gas to the chamber 110 according to a control signal from the control unit 20.

In the HDP-CVD apparatus, however, high-density plasma ($10^{12}/cm^3$ or more) and low pressure (10 mTorr or below) can be used to simultaneously perform deposition and etching. Accordingly, inductively coupled plasma (ICP) for applying high-radio-frequency (high-RF) electric power can be used. The generated low pressure and high-density plasma can cause plasma-induced damage (PID).

Such PID can be classified into two types. The first type is PID generated during an initial stage of an insulating film deposition process. For example, due to non-uniform deposition during an initial stage of an insulating film deposition process, the thickness of an insulating film deposited on the lower side wall of a metal wire may be thinner than the thickness of an insulating film deposited on the upper side wall; and, thus, positive charges may accumulate in the lower side wall and penetrate the insulating film. Moreover, the positive charges penetrate a gate oxide layer connected to the metal wire to generate Fowler-Nordheim (FN) tunneling phenomena. Consequently, the FN tunneling of the positive charges degrades the quality of the gate oxide layer. The PID continues until the insulating film is deposited to a predetermined thickness, for example, 15 nm or more. In particular, when the aspect ratio of the structure is large, the effects of PID become more significant.

The second PID type is the PID generated when vacuum ultra-violet (VUV) radiation having an energy that is higher than a band-gap energy of the insulating film is incident thereto and photo-conduction occurs. In particular, when He is used, the effects of the PID generated by the photo-conduction are more significant.

In order to reduce PID, plasma with the time-modulation mode can be used. Plasma with the time-modulation mode can be used alone, or it can be combined with plasma with a continuous-operation mode. Plasma with a continuous-operation mode can be generated in the chamber 10 by continuously supplying power from the high-frequency generator 10 to the upper electrodes 122 or to the substrate supporter 132. The plasma with the time-modulation mode, on the other hand, can be periodically turned on and off. For example, RF power that is periodically and/or repeatedly turned on and off can be supplied from the high-frequency generator 10; and, thus, plasma with the time-modulation mode can be formed within the chamber 110.

When RF power is turned on, the plasma is formed in the chamber 110, and the inner temperature of the chamber 110 can rise to a high temperature range, for example, from about 600° C. to about 800° C. When RF power is turned off, the inner temperature of the chamber 110 can fall to a low temperature range, for example, about 250° C. In this case, the temperature of the wall of the chamber 110 can be about 75° C. Plasma with the time-modulation mode can be formed by periodically turning on and off the upper RF power applied to the upper electrodes 122 or by periodically turning on and off the lower RF power applied to the substrate supporter 132, acting as a lower electrode, simultaneously with the RF power applied to the upper electrodes 122.

Figure 2:
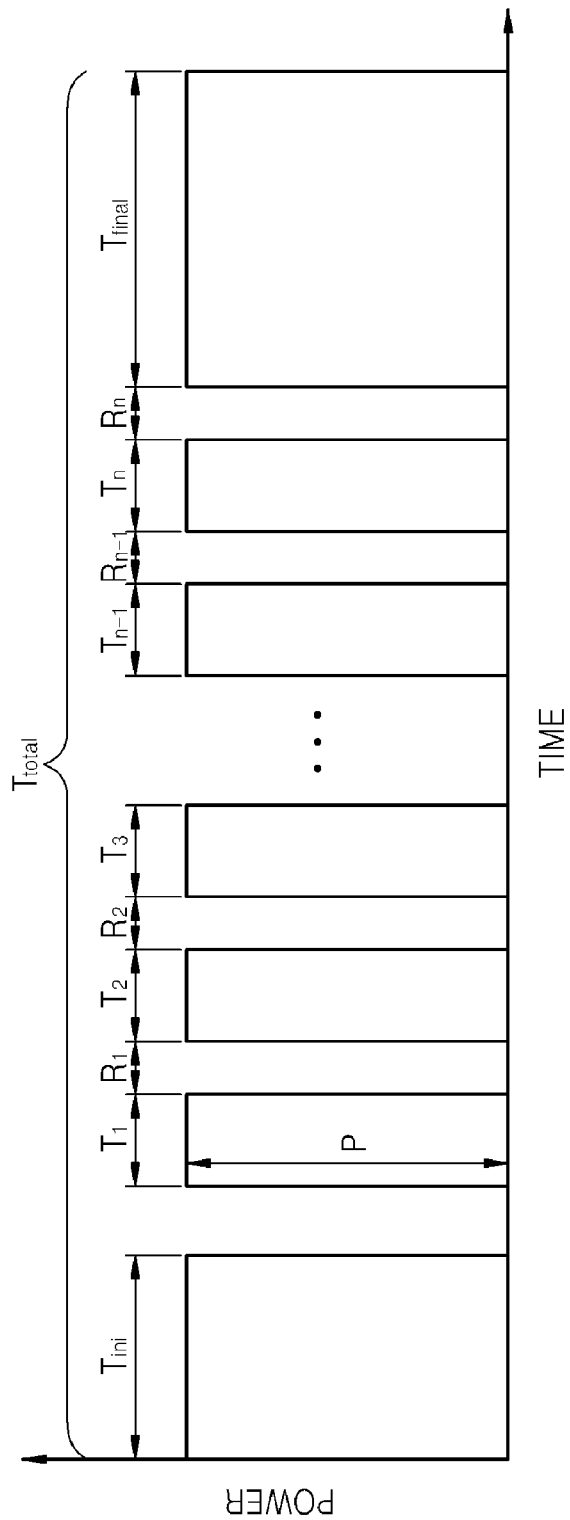
FIG. 2 illustrates process parameters of plasma with a time-modulation mode.

An example set of process parameters of plasma with the time-modulation mode is illustrated in FIG. 2. The process parameters include the intensity of the plasma, P; the application time intervals of the plasma, $T_1$, $T_2$, $T_3$, through to $T_{n-1}$, and $T_n$; the resting time intervals of the plasma, $R_1$, $R_2$, through to $R_{n-1}$, and $R_n$; and the total application time of the plasma, $T_n$. The application time intervals of the plasma, $T_1$, $T_2$, $T_3$, through to $T_{n-1}$, and $T_n$, can be the same as each other or can be increased or decreased. For example, the application time intervals of the plasma, $T_1$, $T_2$, $T_3$, through to $T_{n-1}$, and $T_n$, can be included in a range of about 0.1 seconds to about 10 minutes. Additionally, the resting time intervals of the plasma, $R_1$, $R_2$, through to $R_{n-1}$, and $R_n$, can be the same as each other or can be increased or decreased. The resting time intervals of the plasma, $R_1$, $R_2$, through to $R_{n-1}$, and $R_n$, of the plasma can be included in a range of about 0.001 seconds to about 10 minutes. In addition, as needed, plasma can be continuously applied in predetermined time intervals—that is, over an initial application time interval, $T_{ini}$, at the point when the plasma starts to be applied and over a final application time interval, $T_{final}$, at the point where the plasma is completely applied. The length of the initial application time interval, $T_{ini}$, and the final application time interval, $T_{final}$, can vary according to characteristics of target layers.

Figure 3:
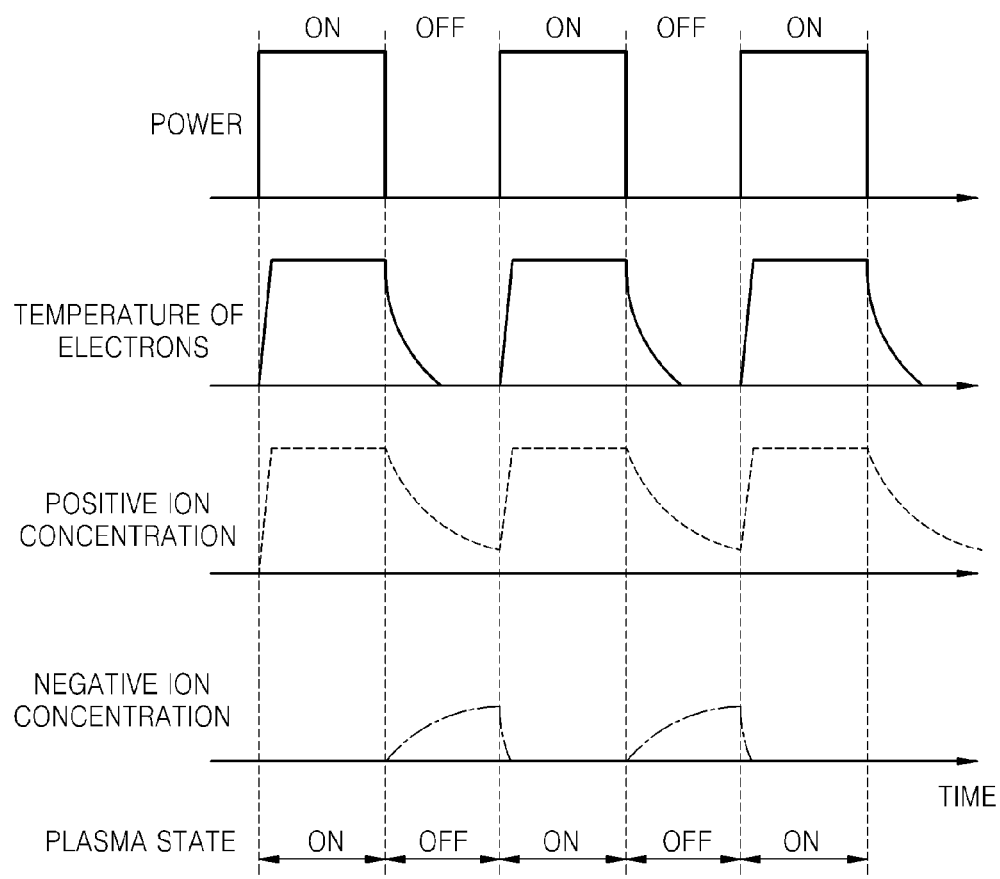
FIG. 3 illustrates characteristics of plasma with a time-modulation mode provided by using pulse-type power.

Exemplary characteristics of plasma with the time-modulation mode provided via pulse-type power are illustrated in FIG. 3. Referring to FIGS. 1 to 3, power for generating the plasma can be provided in a pulse type, whereby power is periodically and repeatedly turned on and off. When power is turned on by the high-frequency generator 10, the temperature of electrons in the process gas can rise to a saturation value with a delay time for temperature rise at the initial stage. Change in the positive ion concentration in the plasma is proportional to the temperature change of electrons, whereas negative ion concentration in the plasma may not be shown. Accordingly, turning on the power turns on the plasma in the chamber 110.

When power is turned off, the temperature of electrons exponentially decreases, and the positive ion concentration also decreases, corresponding to the decrease in the temperature of electrons. The degree of decrease in the positive ion concentration, however, is relatively lower than the degree of decrease in the temperature of the electrons. Thus, generation of negative ions commences, and the concentration thereof is increased. Accordingly, ambipolar diffusion may weaken; a sheath may be diminished; and charge-up neutralization may occur in the chamber 110 due to the generated negative ions. Consequently, the plasma can be turned off, and the effects of PID can be reduced.

When power is repeatedly turned on and off again, the plasma is periodically on and off, as described above. Accordingly, plasma with the time-modulation mode can be provided so that the effects of PID can be reduced or even eliminated.

Figure 4:
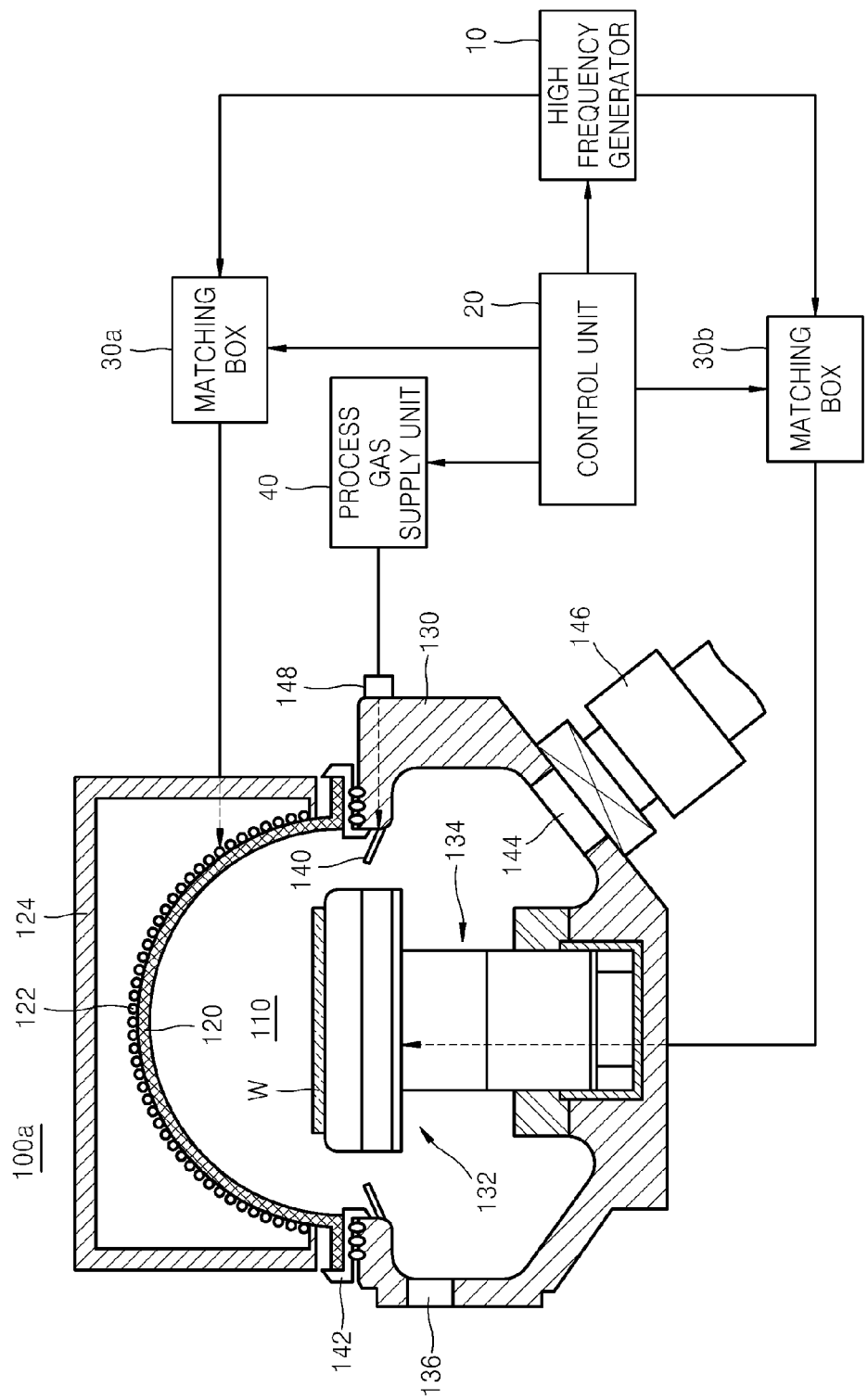
FIG. 4 schematically illustrates an apparatus for processing a substrate, wherein the apparatus includes a high-speed gas puffing valve for controlling the supply of the process gas.

An apparatus 100a for processing a semiconductor substrate is schematically illustrated in FIG. 4. The apparatus 100a for processing a semiconductor substrate includes additional elements compared to the apparatus 100 for processing a semiconductor of FIG. 1. Thus, a description of similar elements is omitted.

Referring to FIG. 4, the process-gas supply unit 40 can further include a high-speed gas puffing valve 148 that can control the process gas supplied to the gas-supply nozzle 140. By periodically turning the high-speed gas puffing valve 148 on and off, plasma with the time-modulation mode can be provided to the chamber 110. Thus, the apparatus 100a for processing a semiconductor substrate can be used to provide plasma with the time-modulation mode in the HDP-CVD apparatus, in the PE-CVD apparatus, or in a plasma etching apparatus.

Characteristics of plasma with the time-modulation mode through use of a pulse-type process gas are illustrated in FIG.

Figure 5:
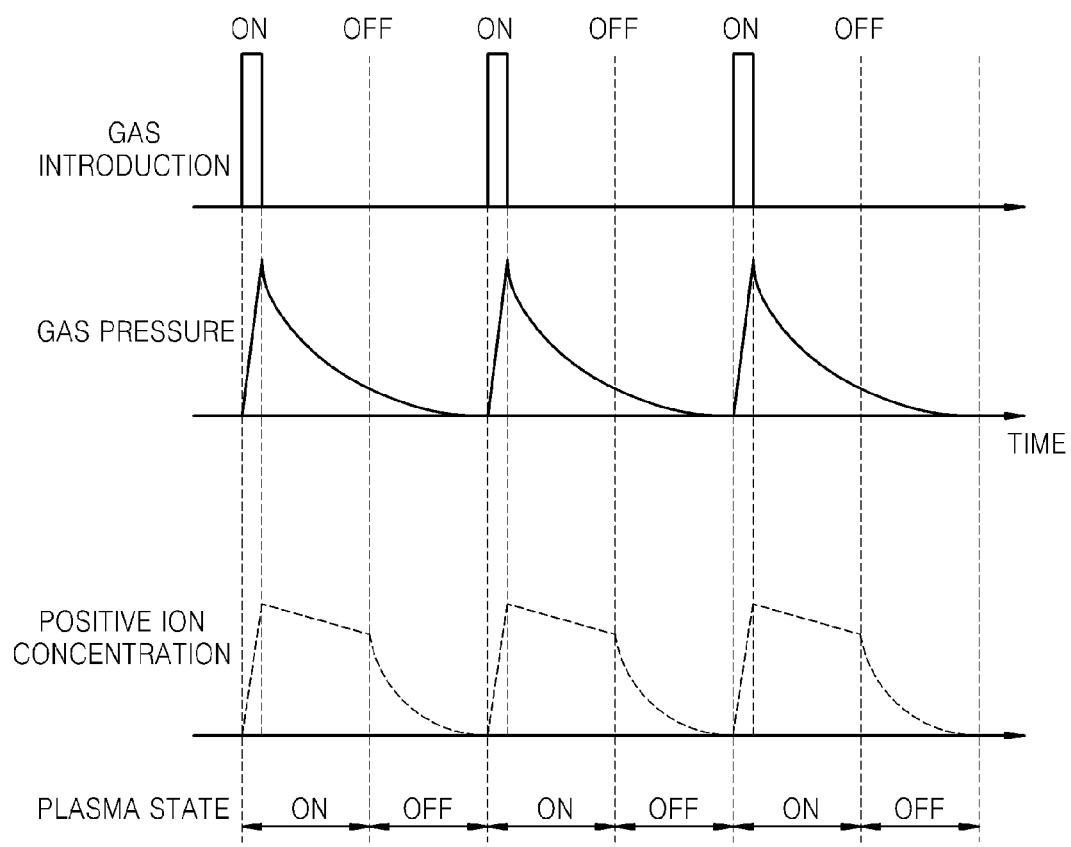
FIG. 5 illustrates characteristics of plasma with a time-modulation mode by using a pulse-type process gas.

5. Referring to FIGS. 4 and 5, the process gas is introduced into the chamber 110 with a pulse-type introduction—that is, the introduction of the process gas is periodically and repeatedly turned on (ON) and off (OFF) in the chamber 110 using the high-speed gas puffing valve 148. When the introduction of process gas is turned on (ON) in the chamber 110 while the power is supplied to the high-frequency generator 10, gas pressure in the chamber 110 increases; consequently, the positive ion concentration increases in the chamber 110. Accordingly, the plasma is turned on in the chamber 110. When pumping of the process gas is turned off (OFF), gas pressure in the chamber 110 exponentially decreases, and the positive ion concentration is linearly decreased. Here, the plasma can remain on and the process can be continued, providing excellent edge coverage.

Then, when the gas pressure in the chamber 110 is further decreased, the positive ion concentration in the chamber 110 exponentially decreases, and the plasma is turned off. Accordingly, neutralization of the electrons in the substrate W can be accomplished, and the damage due to the plasma can be reduced or eliminated.

In such pulse-type process gas introduction, plasma with the time-modulation mode can be generated in a condition where pulse-type RF power is hardly supplied. Moreover, by providing a pressure gradient in the chamber 110, drift movement of the process gas can be increased; consequently, the processed large-sized substrate W can have improved uniformity.

Figure 6:
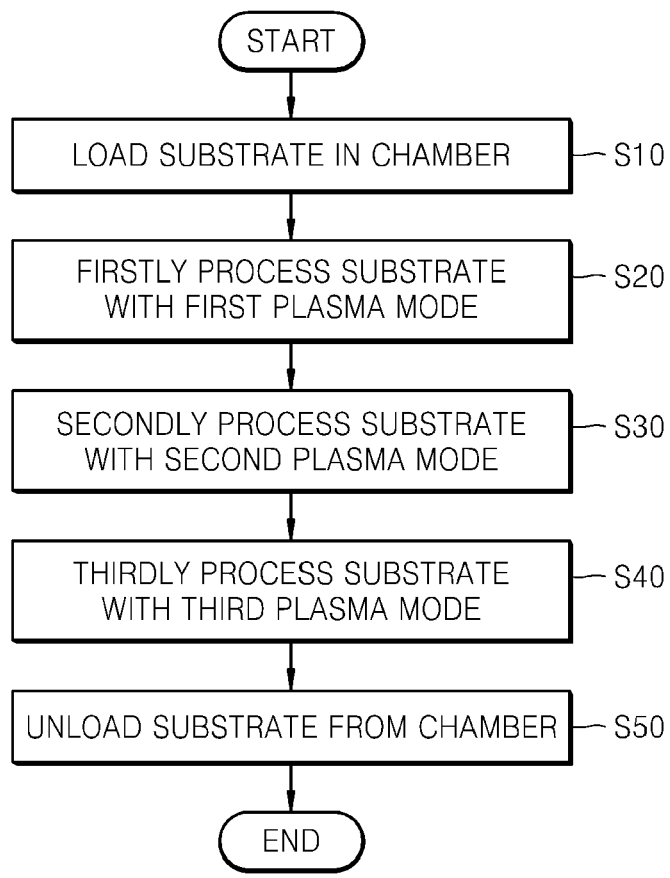
FIG. 6 is a flowchart illustrating a method of processing a substrate.

A flowchart illustrating a method of processing the substrate W is provided in FIG. 6. The method of processing the substrate W according to the current embodiment is described in relation to the apparatuses 100 and 100a for processing a semiconductor of FIGS. 1 and 4. Referring to FIGS. 1 to 6, the substrate W is loaded in the chamber 110, in operation S10. For example, the chamber 110 can be used for HDP-CVD. However, the present embodiment is not limited thereto; and the chamber 110 can be used, for example, for PE-CVD or etching.

In operation S20, the substrate W can be firstly processed with a first plasma mode. For example, the first plasma mode can be the time-modulation mode or the continuous-operation mode, as illustrated in FIGS. 2, 3, and 5. Here, a material layer can be formed on the substrate W, or the plasma can be stabilized without depositing the material layer so as for the substrate W to be pre-processed. For example, the material layer can be an electrically insulating material, such as an oxide or a nitride or an insulating material having a low permittivity.

When a reflected wave having greater intensity than a predetermined tolerance range is generated in the chamber 110, the first plasma mode can be the continuous-operation mode. In this case, the plasma can be maintained for a minimum duration under the pressure condition where the reflected wave can be managed safely, and, thereby, PID to the substrate W can be reduced. However, when there is no possibility of the generated reflected wave having a greater intensity than a predetermined tolerance range in the chamber 110, the first plasma mode can be the time-modulation mode; and, thus, the effects of PID to the substrate W can be reduced or eliminated.

Next, the substrate W can be secondly processed with a second plasma mode in operation S30. Here, a material layer can be substantially deposited on the substrate W or the material layer can be substantially etched. The second plasma mode can be the time-modulation mode, as described in reference to and as illustrated in FIGS. 2, 3, and 5.

When a process pressure in the chamber is maintained, for example, at a high level to prevent generation of a reflected wave, both the first plasma mode and the second plasma mode can be the time-modulation mode. Accordingly, the effects of PID to the substrate W can be reduced or eliminated. In addition, when the process pressure in the chamber 110 is maintained at a low level to generate the reflected wave in an initial stage, the first plasma mode can be the continuous-operation mode, and the second plasma mode can be the time-modulation mode. The second plasma mode can be applied over the entirety of the remainder of the process, or the second plasma mode can be used until the substrate W has a thickness sufficient for PID not to be caused.

Optionally, the substrate W can be thirdly processed in a third plasma mode in operation S40. For example, when a problem occurs due to edge coverage during the final stage of a deposition process performed by the HDP-CVD apparatus, the third plasma mode can be a continuous-operation mode. The process pressure in the third plasma mode can be lower than the process pressure in the second plasma mode; and, thus, deposition of the material layer can be performed under excellent edge coverage conditions. In this case, since the material layer has a sufficient thickness, PID to the substrate W can be prevented. However, when the edge coverage has little or no effect on the process, the third process stage (with the third plasma mode) can be omitted, and the process can be completed after the second stage of the process (with the second plasma mode).

Next, the substrate W can be unloaded from the chamber 110, in operation S50.

According to the method of processing the substrate W, the effects of PID to the substrate W can be reduced or eliminated regardless of the generation of the reflected wave in the substrate W.

Figure 7:
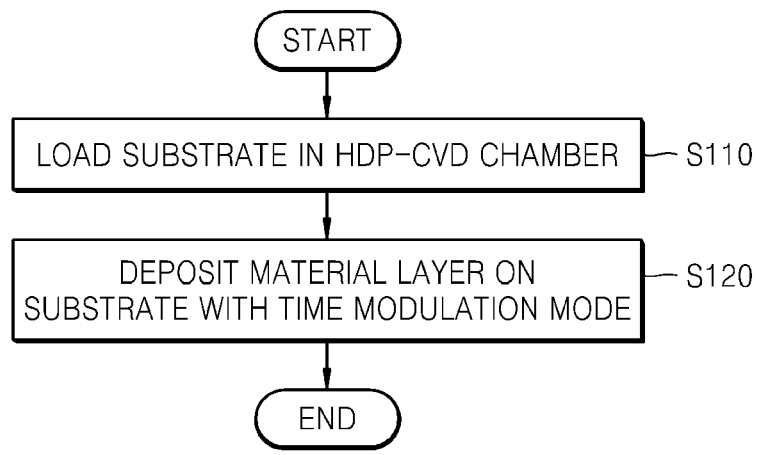
FIG. 7 is a flowchart illustrating another method of processing a substrate.

A flowchart illustrating another method of processing a substrate is provided in FIG. 7. In this process, a substrate can be loaded into a HDP-CVD chamber in operation S110. Next, a material layer can be deposited on the substrate in the time-modulation mode in operation S120. Here, plasma with the time-modulation mode is used throughout the deposition process; and, thus, the effects of PID to the substrate can be reduced or eliminated.

Figure 8:
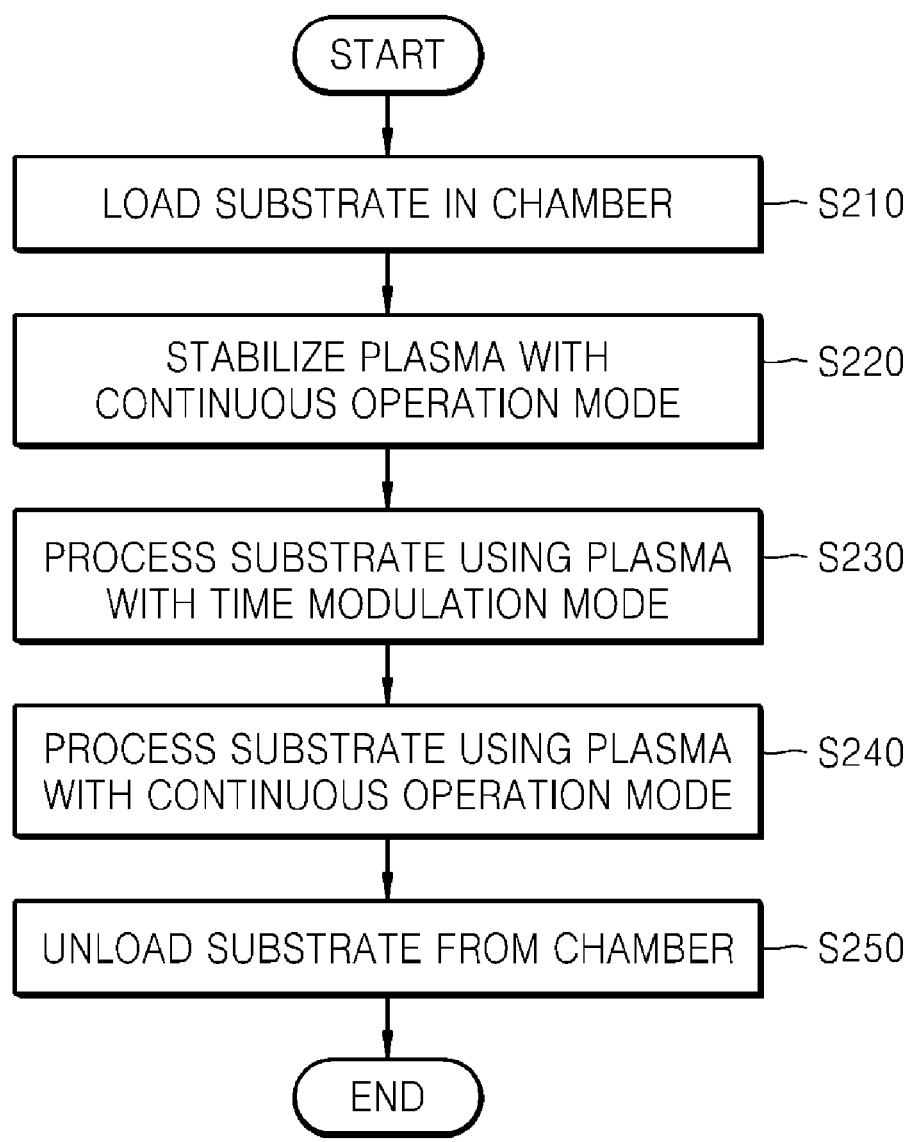
FIG. 8 is a flowchart illustrating yet another method of processing a substrate.

A flowchart illustrating another method of processing a substrate is provided in FIG. 8. In this method, a substrate can be loaded into the chamber in operation S210. The plasma can then be stabilized in the continuous-operation mode in operation S220. Here, substantial deposition of a material layer onto the substrate can be omitted.

In operation S230, the substrate can be processed using plasma with the time-modulation mode. Here, the effects of PID to the substrate can be reduced, and a substantial material layer can be deposited onto the substrate.

In operation S240, the substrate can be processed using plasma with the continuous-operation mode. Here, the process pressure is lowered so as to increase edge coverage; and the material layer can be formed on the substrate. Next, the substrate can be unloaded from the chamber in operation S250.

While various aspects of the method have been particularly shown and described with reference to exemplary embodiments thereof, it will be understood that various changes in form and details can be made therein without departing from the spirit and scope of the following claims; further still, other aspects, functions and advantages are also within the scope of the invention. Additionally, steps, elements and features discussed herein in connection with one embodiment can likewise be used in conjunction with other embodiments. In describing embodiments of the invention, specific terminology is used for the sake of clarity. For purposes of description, each specific term is intended to at least include all technical and functional equivalents that operate in a similar manner to accomplish a similar result.

What is claimed is:

1. A method of processing a substrate, the method comprising:
  loading a substrate in a chamber;
  processing the substrate with a first plasma mode; and then
  processing the substrate with a second plasma mode,
    wherein at least one of the first plasma mode and the second plasma mode is a time-modulation mode in which a plasma induced in the chamber is periodically turned on and off to reduce plasma-induced damage in the substrate, wherein the time-modulation mode is controlled by periodically turning on and off a power supply for inducing the plasma, and wherein the power supply for inducing the plasma includes a first-radio-frequency power supplied to upper electrodes disposed on the substrate and a second-radio-frequency power supplied to lower electrodes disposed under the substrate, and
  wherein, in the time-modulation mode, both the first-radio-frequency power and the second-radio-frequency power are periodically turned on and off.

2. The method of claim 1, wherein the time-modulation mode is controlled by periodically turning on and off introduction of at least one process gas for inducing the plasma.

3. The method of claim 2, wherein the introduction of the at least one process gas is controlled by periodically turning on and off at least one high-speed gas puffing valve attached to the chamber.

4. The method of claim 1, wherein both the first plasma mode and the second plasma mode are the time-modulation mode.

5. The method of claim 1, further comprising processing the substrate in a third plasma mode after processing the substrate in the second plasma mode.

6. The method of claim 5, wherein the third plasma mode is a continuous-operation mode in which the plasma is continuously turned on.

7. The method of claim 6, wherein a pressure in the chamber in the third plasma mode is lower than a pressure in the chamber in the second plasma mode.

8. The method of claim 5, wherein the first plasma mode, the second plasma mode, and the third plasma mode are the time-modulation mode.

9. The method of claim 1, wherein the chamber is at least a portion of a high-density plasma chemical vapor deposition apparatus.

10. The method of claim 9, wherein at least one of the processing of the substrate in the first plasma mode and the processing of the substrate in the second plasma mode comprises depositing a material layer on the substrate.

11. The method of claim 10, wherein the material layer comprises an insulating material.

12. A method of processing a substrate, the method comprising:
  loading a substrate in a chamber;
  processing the substrate with a first plasma mode, wherein the first plasma mode is a continuous-operation mode in which a plasma is continuously turned on in the chamber, and then
  processing the substrate with a second plasma mode, wherein the second plasma mode is a time-modulation mode in which a plasma is periodically turned on and off in the chamber to reduce plasma-induced damage to the substrate.

13. The method of claim 12, wherein a pressure in the chamber in the second plasma mode is higher than a pressure in the chamber in the first plasma mode.

14. A method of processing a substrate, the method comprising:
  loading a substrate in a chamber of a high-density plasma chemical vapor deposition apparatus;
  depositing a material layer on the substrate using a plasma with a time-modulation mode, wherein the plasma in the time-modulation mode is obtained by periodically turning on and off the plasma induced in the chamber to reduce plasma-induced damage in the substrate, and
  stabilizing the plasma in a continuous-operation mode, in which the plasma is continuously turned on, before depositing the material layer.

* * * * *